United States Patent [19]

Riederer

[11] Patent Number: 4,739,766
[45] Date of Patent: Apr. 26, 1988

[54] NMR BLOOD VESSEL IMAGING METHOD AND APPARATUS

[75] Inventor: Stephen J. Riederer, Durham, N.C.

[73] Assignee: Duke University, Durham, N.C.

[21] Appl. No.: 897,597

[22] Filed: Aug. 18, 1986

[51] Int. Cl.$^4$ ............................................. A61B 5/05
[52] U.S. Cl. .................................... 128/653; 324/309
[58] Field of Search ............... 128/653; 324/306, 307, 324/309

[56] References Cited

U.S. PATENT DOCUMENTS

| | | | |
|---|---|---|---|
| 4,086,916 | 5/1978 | Freeman et al. | 128/663 |
| 4,166,454 | 9/1979 | Meijer | 128/689 |
| 4,204,225 | 5/1980 | Mistretta . | |
| 4,504,908 | 3/1985 | Riederer . | |
| 4,516,582 | 5/1985 | Redington | 324/309 |
| 4,523,596 | 6/1985 | Macovski | 128/653 |
| 4,532,474 | 7/1985 | Edelstein | 324/309 |
| 4,570,119 | 2/1986 | Wehrli et al. | 324/306 |
| 4,573,014 | 2/1986 | Riederer . | |
| 4,587,489 | 6/1986 | Wehrli | 324/309 |
| 4,602,641 | 7/1986 | Feinberg | 128/653 |
| 4,643,979 | 1/1987 | Riederer . | |

OTHER PUBLICATIONS

Frahm, et al. "Rapid NMR Imaging of Dynamic Processes Using the Flash Technique" Mag. Res. in Med. 3:321-327 (1986).
Herfkens, et al. "Rapid Dynamic NMR Imaging of the Heart: Initial Clinical Experience" Proc. Soc. Mag. Res. in Med., Montreal, Aug. 1986.
Mansfield, et al. "Biological and Medical Imaging by NMR" J. Mag. Res. 29: 355-373 (1978).
Kaufman, et al. *Nuclear Magnetic Resonance Imaging in Medicine.* Igaki-Shoin, New York, 1981.
Hasse, et al. "Rapid Images and NMR Movies" Proc. Soc. Mag. Res. in Med., London Aug. 1985.
Wedeen, et al. "Projective Imaging of Pulsatile Flow with Magnetic Resonance" Science 230:946-948 (1985).

*Primary Examiner*—Kyle L. Howell
*Assistant Examiner*—Ruth S. Smith
*Attorney, Agent, or Firm*—Richard E. Jenkins

[57] ABSTRACT

High speed selective imaging of blood vessels is accomplished by subjecting an area of interest to a plurality of short repetition time NMR pulse sequences during each high velocity period and low velocity period of a heart beat cycle for several or more heart beats. The imaging data from each NMR pulse sequence is collected and weighted according to whether it corresponds to a high velocity period or a low blood velocity period. The weighted imaging data corresponding to high blood velocity periods is then subtracted from weighted imaging data corresponding to low blood velocity periods and the resulting data used to form an image which depicts only the blood vessels of interest. Also, an imaging data processing apparatus is disclosed which operates in real time so as to permit an operator to optimize diagnostic performance.

20 Claims, 3 Drawing Sheets

| n | p(n) | v(n) | s(n,t) | w(n) |
|---|---|---|---|---|
| 1 | | | | |
| 2 | | | | |
| 3 | | | | |
| 4 | | | | |
| ... | | | | |
| 256 | | | | |

NMR BLOOD VESSEL IMAGING METHOD AND APPARATUS

DESCRIPTION

1. Technical Field

The present invention generally relates to an apparatus and a method for rapidly producing images of blood vessels within a body, such as a human body, utilizing data derived from NMR measurement techniques. More particularly, this invention provides an improved apparatus and method for producing images of blood vessels in a minimal time period through the use of short repetition time NMR pulse sequences and image subtraction.

2. Background Art

Nuclear magnetic resonance (NMR) has seen increasing acceptance in recent years as a diagnostic tool for producing images of the interior portions of the human body. NMR diagnostic medical imaging is particularly attractive since it does not subject a patient to the potentially hazardous X-rays utilized in most prior art imaging technology. However, a potential disadvantage of NMR diagnostic use is the relatively long scan time required in order to form certain images. Presently, this scan time is on the order of about 5 minutes or more for most human imaging applications, including scanning for imaging blood vessels, and therefore provides a limitation to its clinical usefulness in this application.

A major objective of diagnostic medical imaging is the selective portrayal of blood vessels. This is now routinely accomplished utilizing X-ray angiography which provides for acquiring X-ray images both with and without a contrast agent in the blood vessel and then subtracting the images from each other. The major drawback of X-ray angiography is the invasiveness of the procedure and the resulting trauma to the patient resulting from administering an X-ray contrast agent into the blood vessels. NMR technology has been applied in recent times to the task of imaging blood vessels, but an extensive scan time of five or more minutes has resulted in NMR technology not being widely adopted for this use. Therefore, the search for a clinically useful application of NMR technology to blood vessel imaging has continued and a clinically useful application of NMR technology for imaging blood vessels has not yet been developed.

DISCLOSURE OF THE INVENTION

In accordance with the present invention, applicant provides a method and apparatus for use in diagnostic imaging of blood vessels which is able to generate high quality images of the vessels in significantly less time than has heretofore been possible with NMR imaging.

In order to fully appreciate the instant invention, it should be understood that a major goal of diagnostic imaging has been the selective visualization of blood vessels with a completely non-invasive technique. This is now possible with NMR imaging in view of the present invention which provides for the novel combination of three conventional imaging concepts into a new method and apparatus. The first concept is that of subtraction. The imaging concept of subtraction allows for one image to be made of the anatomy of interest and a second image to be made of the same anatomy but under different conditions in which the appearance of the anatomy has been altered in a well understood manner. Upon subtraction of the two images, a selective image remains only of the anatomy of interest since signals for all other structures in the anatomy have not changed and thus cancel. The concept of image subtraction is used in both conventional X-ray and digital X-ray subtraction angiography. In both cases one image is made prior to administration of an X-ray contrast material. The second image is made under the condition of contrast material being present in the blood vessels of interest. Upon subtraction, all non-vessel structures are cancelled in the difference image and a selective image remains of the blood vessels themselves.

The second concept utilized in the present invention is the concept of contrast, or the difference between two signals. In the case of NMR imaging, contrast can be due to various causes, such as differences in relaxation times of the two materials. For the specific case of the contrast between flowing blood and other structures such as static structures or stationary blood, contrast can also be generated in various ways. One specific means is the dephasing experienced by nuclear spins moving in a gradient. In order to appreciate this concept, one must understand that when fluid moves in the direction of a magnetic field gradient, it accumulates a shift in phase compared to static structures. Moreover, the variation of velocities within the fluid will cause a variation of phases of the corresponding magnetizations. This dephasing causes a reduction in the NMR signal from the fluid. On the other hand, a stationary fluid experiences no such dephasing and its signal is maintained. Therefore, if the velocity of a fluid is pulsatile, different signals will be measured at peak velocity and at minimal velocity when the pulsatile fluid is subjected to NMR pulses. This signal difference can serve as the basis for the blood vessel signal in the subtraction imaging of the blood vessels of interest.

Alternative means are also possible for generating a difference signal from the flowing blood. One possibility is to incorporate an additional bipolar gradient in any of the three spatial directions into the pulse sequence of interest and acquire the NMR signal. Next, the process is repeated exactly except that the polarity of the bipolar gradient is reversed. Upon subtracting the second measured signal from the first measured signal all contributions from static structures are eliminated as desired. However, signal still remains from the flowing blood and a selective vessel image can then be constructed. Other variations of these two approaches are possible but the central concept is to form a difference signal entirely due to flowing magnetization.

The third concept utilized by applicant in the inventive method and apparatus, and critical thereto, is the use of short repetition times in NMR imaging as a means for reducing scan time of the blood vessels of interest to the two-ten second range as opposed to a more conventional time requirement of about five minutes or more. One specific way in which short repetition times are permitted without significant loss of detected signal is via the use of partial or limited flip angles (LFAs), typically less than 90 degrees.

Briefly, the invention achieves high speed selective imaging of blood vessels in a completely non-invasive manner by subjecting a predetermined body area containing blood vessels of interest to a plurality of short repetition time NMR pulse sequences during each high velocity period and during each low velocity period of blood flow for a plurality of heart beat cycles, and then collecting data from which an image of the blood vessels can be formed. In the preferred embodiment, the signal from the vessels is formed by weighting the collected imaging data from each application of the NMR pulse sequence according to whether the data corresponds to the high blood velocity period or the low velocity period of its corresponding heart beat cycle. The weighted imaging data is then accumulated for a plurality of applications of an NMR pulse sequence corresponding to high blood velocity periods, and weighted imaging data is also accumulated for a substantially equal number of NMR pulse sequences corresponding to low blood velocity periods. The weighted imaging data corresponding to the high blood velocity periods is now subtracted from the weighted imaging data corresponding to low blood velocity periods, and the resulting data is utilized to form an image which depicts only the blood vessels of interest since all other structure has been canceled from the image. This can be accomplished by utilizing limited flip angle NMR pulse sequences and TR times as short as 10 msec. By way of example, if during 50% of the cardiac cycle blood is flowing at high velocity, and in the remaining 50% is flowing at zero or negligible velocity, then an image of the blood vessels may be obtained in about 12.8 seconds when 128 repetitions of an NMR pulse sequence are made of the blood vessels during the high velocity period of the heart beat cycle and 128 repetitions are made of the blood vessels during the low velocity period of the heart beat cycle with a TR time of 50 msec.

The invention also provides for a video processor for constructing and displaying of real time images of selected blood vessels of interest which are derived from NMR measurements and comprising means for monitoring blood pressure, means for performing NMR measurements on blood vessels using a plurality of limited flip angle pulse sequences during both the high velocity period of a heart beat cycle and the low velocity period of a heart beat cycle, means for calculating and storing NMR measurement data and blood pressure data after each pulse sequence to create imaging data, means for computing an average of previous successive imaging data contributions and adding each new imaging data contribution thereto so as to provide updated imaging data, and means for successively constructing and displaying blood vessel images on a real time basis which are derived from the updated data.

In summary, applicant has devised a method for imaging blood vessels with NMR at a high speed which has not heretofore been possible. The method of the invention may be implemented on many generic NMR imaging systems in a retrospective fashion. Moreover, the applicant has also provided an improved NMR apparatus for performing blood vessel imaging in real time during the actual acquisition of the image and thereby facilitating the optimization of diagnostic performance.

Therefore, it is an object of the present invention to provide a method for the NMR imaging of blood vessels which reduces the extensive scan time heretofore required.

A further object of the present invention is to provide an NMR method for imaging blood vessels in a significantly reduced scan time so as to be clinically useful and thereby obviate the need to utilize invasive X-ray techniques with the attendant patient trauma.

Yet another object of the present invention is to provide an apparatus for NMR imaging of blood vessels which creates imaging in real time so as to optimize diagnostic effectiveness of the NMR procedure.

Still another object of the present invention is to provide a method and apparatus for the selective imaging of blood vessels in a non-invasive, rapid and accurate manner.

BRIEF DESCRIPTION OF THE DRAWINGS

A more complete appreciation of the invention and many of the attendant advantages thereof will be readily obtained as the same becomes understood by reference to the following detailed description when considered in connection with the accompanying drawings, wherein.

BEST MODE FOR CARRYING OUT THE INVENTION

As mentioned hereinbefore, and as is well understood in the art, NMR imaging of blood vessels has previously suffered from an extensive scan time of five or more minutes. This has tended to render NMR imaging of blood vessels as an unsuitable clinical technique although the non-invasive character of NMR blood vessel imaging is a very attractive attribute. The instant invention allows for the clinical application of NMR blood vessel imaging by significantly reducing the scan time while maintaining the non-invasive character thereof. Although the novel method may be practiced on existing NMR imaging systems for the acquisition of the image data, a novel apparatus is also provided for taking the acquired data and reconstructing the blood vessel image in real time in order to facilitate optimization of diagnostic performance.

Figure 1:
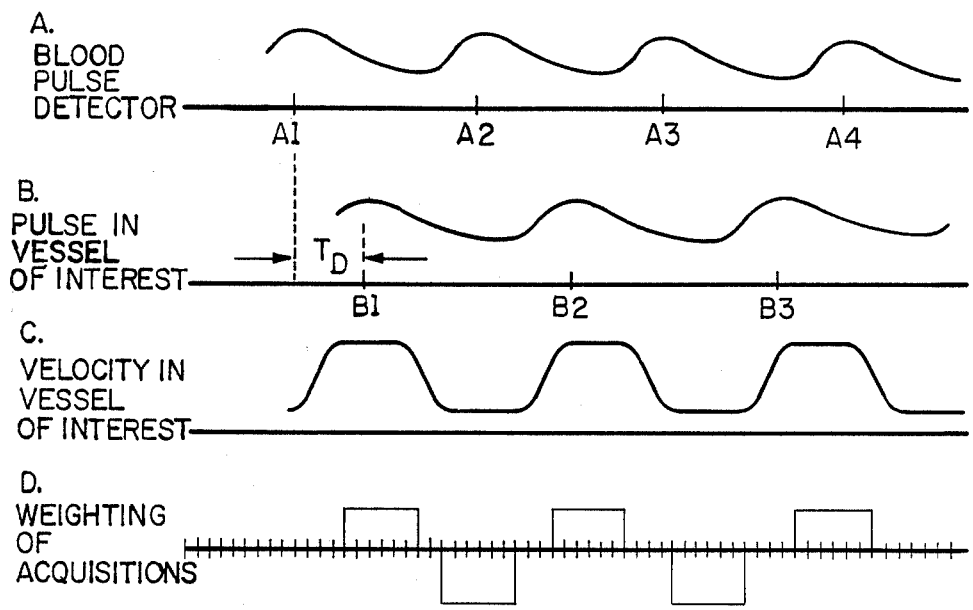
FIG. 1 is a graphical representation of NMR imaging of blood vessels according to the instant invention for purposes of clarity of explanation.

Reference should now be had to FIG. 1 for a better understanding of the method of the present invention. First of all, FIG. 1A is a plot of the blood pressure or cardiac activity measured at some point in the body of the subject of the diagnostic test. This may be accomplished with an electrocardiogram (ECG) recording, as a recording from an optical plethysmograph (pressure monitor) which is attached to the earlobe or finger tip of the subject or with an ultrasonic pulse detector. The blood pressure recording of FIG. 1A is used for subsequent timing purposes. FIG. 1B is a plot of the blood pressure in the blood vessel under study. It generally resembles the waveform of FIG. 1A and has an identical cycle time or period, but each cycle can be delayed or advanced by a certain delay time TD. FIG. 1C shows the average velocity in the blood vessel under study. A comparison of this plot with FIG. 1B indicates that high pressure corresponds to high velocity and low pressure corresponds to low velocity (which can actually be zero or negative or retrograde). As will be appreciated by one familiar with the art, the NMR signal of the blood at high velocity is reduced because of dephasing while the NMR signal remains strong at low velocity because blood motion is very limited. Finally, FIG. 1D represents a sequence of NMR acquisitions with each vertical hash mark representing one complete cycle or repetition and typically corresponding to a 20–50 msec repetition time period TR. During each of the cycles in a conventional two-dimensional Fourier transform acquisition technique, NMR data is acquired for one line or strip of the Fourier transform of the image to be constructed and in this fashion a complete image is constructed from a large number of cycles, most typically either 128 or 256 cycles. As one who is familiar with the art will also fully appreciate, the aforementioned strips are strips in Fourier space with the exact location of each strip being determined by an associated phase encoding gradient.

As noted earlier, the subtraction concept utilized by the invention has a primary objective of acquiring two images in which the signals of flowing blood are different in each image but those from static structures are the same in both images. When the images are subtracted all materials and structure in the images other than the blood vessels themselves will yield a zero signal or cancel out. In the preferred embodiment the individual images are each constructed by acquiring a relatively large number of cycles of the 20–50 msec TR period NMR data and then weighting each individual data acquisition by +1 (if it corresponds to high blood velocity) or −1 (if it corresponds to low blood velocity). That is, the pulsatile nature of the blood flow serves as the basis for the difference signal. In other embodiments different gradient waveforms can be applied to generate a difference signal from the flowing blood. The weights are shown as pulses in FIG. 1D. For example, if 256 NMR pulse sequences and corresponding data acquisitions are utilized, upon accumulating 128 different phase encodings with the weight of +1 an image with the reduced vessel signal is constructed. Correspondingly, upon accumulating 128 phase encodings with a weight of −1 an image with a high vessel signal is constructed. Ideally, the set of phase encodings accumulated for the positively weighted image is substantially the same as for the negatively weighted image. The difference between these two images accomplished by subtraction will be the difference image which selectively portrays the blood vessels of interest.

The time required to acquire the image data can be estimated for an idealized case as follows. Assume that the subject's heart rate is one beat per second and that during each cycle peak velocity occurs for 500 msec and zero velocity occurs for the remaining 500 msec. Assume also that the TR time required for the NMR data acquisition is 50 msec through use of limited flip angle radiofrequency pulses. Then in each heart cycle 10 separate phase encodings (500/50) could be acquired for each of the high velocity and zero velocity images. With a total of 128 phase encodings required to construct the images, the total data acquisition time would be 12.8 seconds (128/10). This 12.8 second time was estimated for the case in which the difference signal was generated from the dephasing of the signal of the high velocity blood. For alternative means of generating the difference signal, such as alternate applications of bipolar gradients of opposite polarity, the time requirements are essentially the same. Total scan time would be equal to two times the number of phase encodings times the repetition time. In the above example this is equal to 2·128·50 msec or 12.8 seconds. The 12.8 second total acquisition time is significantly faster than the present five minute acquisition time and renders NMR blood vessel imaging feasible for clinical use. The major deficiency of NMR techniques for blood vessel imaging is obviated with the reduction of scan time to form an image from 5 minutes or more to about 13 seconds.

To again focus on the novelty of the present method, it should be noted that the high speed NMR blood vessel imaging technique utilizes three separate imaging concepts in a novel combination to achieve the significant reduction in time required to construct an image. First is the use of some means such as the distinction between high and zero blood velocity signals to provide two unsubtracted images in which the blood vessels of interest appear differently while all other materials and structure remain constant. Second is the acquisition of at least several and preferably a large number of individual phase encodings of both types of signals within a single cardiac cycle. Finally, and very significantly, is the use of limited flip angle radiofrequency pulses in conjunction with very short TR times in the 20–50 msec range to provide the requisite number of signals to construct the image in a short time period.

Figure 2:
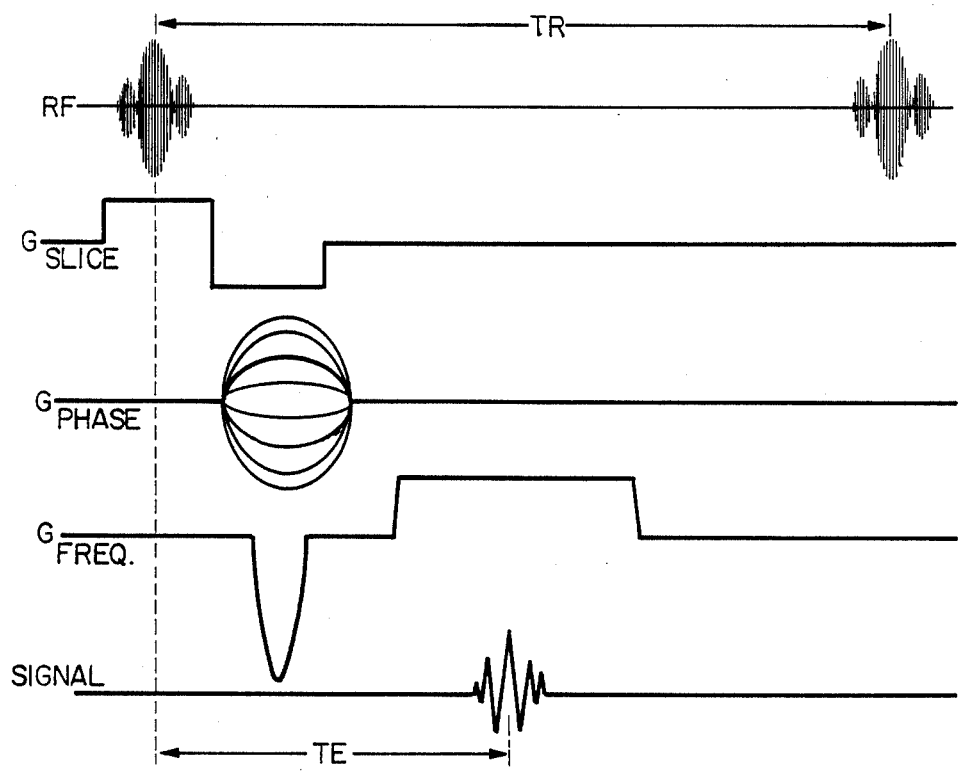
FIG. 2 is a graphical representation of characteristics of a limited flip angle pulse sequence for purposes of clarity of explanation.

To better understand the limited flip angle radiofrequency pulse sequence utilized by the instant invention, reference should now be had to FIG. 2 of the drawings which depicts one possible use of limited flip angle pulse sequences. Illustrated from top to bottom of the drawing are waveforms for the radiofrequency (RF) power applied to the sample, three gradient waveforms, and the detected signal. The three gradient waveforms correspond to the directions of the slice selection, the phase encoding, and the frequency encoding. In conventional NMR scanning these three labels ($G_{slice}$, $G_{phase}$, $G_{frequency}$) are assigned to directions along the patient. For example, for the imaging of transverse cross-sections the slice selection direction is from top to bottom, and for typical anterior-posterior projection imaging the slice selection is from front to back.

The limited flip angle pulse sequence works as follows. The radiofrequency (RF) power is applied at the same time as the application of the slice selection gradient. Additionally, the high frequency (e.g., 60 MHz for protons at a field strength of 1.5 Tesla) RF power is modulated by a lower frequency such that its bandwidth is spread out to a desired value. This modulation is shown in FIG. 2 as the three rounded lobes of the radiofrequency wave. The combination of the modulated radiofrequency signal and the slice selecting gradient causes the magnetization only within a prescribed slice to be nutated or flipped. The thickness of the slice to be imaged can be controlled by adjusting the magnitude of the gradient and/or the degree of modulation of the RF signal. In the limit of a true projection image the net thickness would be very large and no slice selecting gradient would be applied during the radiofrequency signal.

Having explained how magnetization from a desired slice can be flipped or nutated, applicant will next explain how the degree of nutation is controlled. This is accomplished by adjusting the amplitude of the RF waveform such that the angle of nutation is proportional to this amplitude. For example, if a certain amplitude is known to provide a flip angle of 90 degrees, then the amplitude can be reduced by a factor of three and application of the modified RF pulse will then provide a flip angle of substantially 30 degrees. In this fashion, the flip angle of the RF pulse can be controlled.

The phase encoding gradient is shown as having a variable pulse height since the amplitude of this signal is used to control the amount of phase twist applied to the magnetization vectors within the slice which has previously been isolated by the RF wave and slice detecting gradient as just described above. Each time it is desired to measure the signal for a different spatial frequency in the phase encoding direction, then a different amplitude of this gradient must be applied. For example, a desired resolution of 256 pixels along this direction of the resulting image requires that 256 different amplitudes of the phase encoding gradient must be applied individually and consequently 256 cycles of the entire pulse sequence must be performed.

The frequency encoding gradient is also shown in FIG. 2. The first large negative lobe thereof is a prephasing gradient which assures that during the subsequent readout all spins are in phase at the time of the center of the spin-echo pulse sequence utilized by the invention. The positive gradient is applied during readout to encode spatial position with temporal frequency. That is, if the gradient is applied such that the magnetic field increases in going from left to right, then pixels on the left side of the object will have slightly lower precessional frequencies than those on the right side of the object. Such pixels can then be distinguished from each other in a spectral analysis or Fourier transform of the detected signal.

In the pulse sequence shown in FIG. 2 the signal is measured at a desired echo time TE following the initial RF pulse. In this example, the echo is caused by reversing the polarity of the frequency encoding gradient midway through the cycle. Other ways of forming a spin-echo signal are possible and known to those familiar with the art, the most notable being the application of a 180 degree RF pulse at some time after application of the phase encoding gradient. The pulse sequence shown can be re-initiated at a later TR repetition time. For example, for an acquisition in which 256 individual phase encodings are required to form the image, the total acquisition time would be 256 multiplied by TR. The value of this sequence is for flip angles which are less than 90 degrees since substantial longitudinal magnetization will remain after application of the RF pulse. This means that the TR time need not be long to enable significant restoration or recovery of this magnetization to occur since it is already relatively large. Therefore, TR times as small as 20 msec can be permitted and with 256 phase encodings this allows for acquisition of a net image in about 5 seconds.

Figures 3, 4:
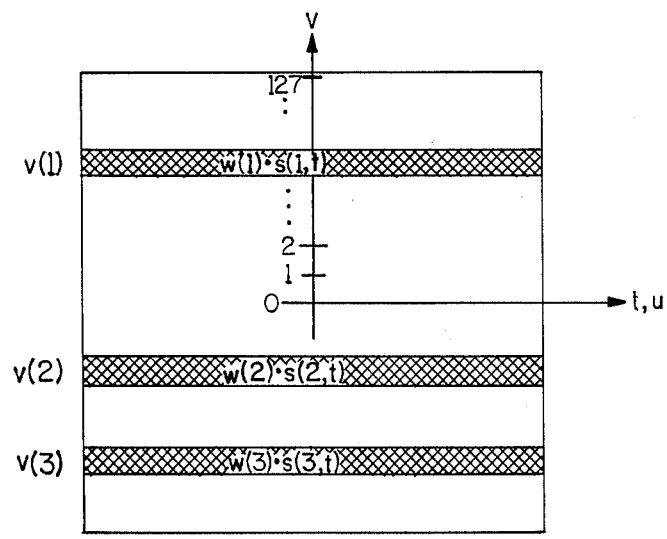
FIG. 3 is a schematic diagram showing how imaging data is acquired and processed according to the instant invention.
FIG. 4 is a schematic diagram showing how imaging data is acquired in Fourier space.

The method can be further explained by referring to FIG. 4 which is a schematic diagram of the two-dimensional Fourier transform of an unsubtracted NMR image. In this diagram t represents time, and specifically the time over which the signal of FIG. 2 is measured. The point t=0 corresponds to the central time of the detected signal, a time TE delayed from the center of the RF pulse. Other variables shown in FIG. 4 are u and v, which correspond to the spatial frequencies along the x and y directions, respectively. As shown in FIG. 4, u is proportional to t. This assumes that the direction of the frequency encoding gradient $G_{frequency}$ of FIG. 2 is along the spatial direction corresponding to u, the x direction in this case. Additionally, FIG. 4 assumes that the v or y direction corresponds to the direction of the phase encoding direction of FIG. 2.

This discussion of FIG. 4 can be made relevant to this application as follows. The goal of any NMR imaging strategy is to acquire data for a complete set of values of u and v; for example $|u| \leq U$ and $|v| \leq V$ for some maximum spatial frequencies U and V. With the two-dimensional Fourier transform (2DFT) method, which is shown in FIG. 4, this acquisition is performed by acquiring data for one "strip" with one repetition of the NMR pulse sequence. In this case, a strip corresponds to the narrow band or line v=constant such as v=v(1) of FIG. 4. Different strips of u - v space of FIG. 4 can be sampled by adjusting the amplitude of the phase encoding gradient of FIG. 2. That is, a large negative lobe of $G_{phase}$ will provide information along a strip with a large negative value of v, such as v(3) of FIG. 4. Changes in the amplitude of $G_{phase}$ will provide proportionate changes in the value of v along which the strip of FIG. 4 is sampled. The use of a specific value for $G_{phase}$ and the measurement made along the corresponding strip in u - v space is conventionally called a "phase encoding". With the 2DFT approach for NMR data acquisition, if data is to be acquired for, by way of example, 128 strips of the u - v space of FIG. 4 then 128 cycles of the NMR pulse sequence must be applied. In this case the total scan time for one image is equal to 128 times the repetition time TR.

This discussion of FIG. 4 applies to the acquisition of data for a single unsubtracted NMR image. Returning now to the instant invention, the goal in this case is to essentially acquire data for two such diagrams as that of FIG. 4, one diagram for the high velocity image and one for the low velocity image. In this case if 128 phase encodings are to be obtained for each image, then at least 256 repetitions of the NMR pulse sequence must be applied.

A potential problem in the subtraction angiography case is one of timing. This can be explained as follows. Assume the individual phase encodings correspond in FIG. 4 to v=0, 1, 2, ..., 127. Now pick a specific encoding such as v=5. During the acquisition this encoding is ideally applied only twice, once during high and once during low velocity. The problem is to ensure that this happens as nearly as possible. For example, if the v=5 encoding were applied twice but in both instances during high velocity, then upon taking the difference between corresponding measurements, one would be left with zero difference signal from the blood.

This potential problem can be minimized as follows. Referring back to FIG. 1, the blood pulse monitor is a measure of the cardiac period which by way of example we take as 1 second. Additionally, assume a TR of 100 msec. Then, during one-half the cardiac period as many individual phases encodings should be applied as possible. In this example this would be (½) (1 sec)/(100 msec) or 5 separate encodings such as those for v=1, 2, 3, 4, 5, of FIG. 4. In the next cardiac half period these same phase encodings would be repeated. That is, the ten encodings applied during the initial one second of scanning would be v=1, 2, 3, 4, 5, 1, 2, 3, 4, 5. Because the two applications of v=1 are separated by one-half the cardiac period, the probability is high that one application will occur during high velocity and the other during low velocity as desired. During the second cardiac cycle the encodings would be v=6, 7, 8, 9, 10, 6, 7, 8, 9, 10. This process would repeat until all neccesary phase encodings had been applied twice.

Applicant will also use FIG. 4 to refer to earlier work of Mansfield et al. and point out how this invention is different. Mansfield proposed to sample all of u-v space with a single NMR 20–100 msec signal in conjunction with oscillating gradients. That is, all strips of Fourier space of FIG. 4 are sampled in one signal with this approach. Although this leads to scan times approximately a factor of 100 times faster than these discussed herein (100 msec vs. 10 sec), the high sampling rate required and the high bandwidth renders the results very noisy and of little value. Moreover, Mansfield did not propose that his method be used in conjunction with subtraction.

The method of the invention discussed hereinbefore can be implemented on many generic NMR imaging systems. For a fuller understanding, a schematic of how the data is acquired and processed on a generic NMR imaging system according to the invention is shown in FIGS. 3 and 4. With reference first to FIG. 3, it can be seen that the first column is the index n which corresponds to time. During each n interval an individual NMR acquisition is made of a duration time TR, where TR can be in the 20–50 msec range. The second column is labeled p(n) and represents the value during the interval n of the blood pulse detector (the signal shown in FIG. 1A). P(n) is recorded during the NMR scan with equipment described previously. The third column of FIG. 3 is v(n) which indicates the specific phase encoding used during the interval n. These encodings correspond to the various amplitudes of the y-gradients applied during the scan and each v(n) assumes one of typically 128 possible values. The next quantity shown is s(n,t) which is the spin-echo signal recorded as a function of time during the interval n. Typically this signal consists of 256 points.

All of the values discussed thus far, n, p(n), v(n) and s(n,t), are recorded during the actual NMR imaging scan. One way to perform the reconstuction of the subtraction or difference image will now be described. After the phase encodings v(n) have been acquired continuously for 10–12 seconds, the scan is terminated. Next, the weighting factors w(n), the last column of FIG. 3, are generated. This is done by first assuming a certain time delay TD (shown in FIG. 1B) and delaying the p(n) sequence by this amount. Next an offset is subtracted from the delayed p(n) curve so that the average value is zero. This sequence, called w(n), represents the weight to be applied to the signal acquired during the interval n. In an idealized case the w(n) values correspond to the positive and negative values of the square pulses shown in FIG. 1D.

The data is next prepared for reconstruction. Essentially, each signal s(n,t) is assigned to a strip in Fourier space as shown in FIG. 4. The process starts with s(1,t). It is multiplied by the weight w(1) and assigned to the strip v=v(1) in Fourier space. Next, signal s(2,t) is multiplied by weight w(2) and assigned to strip v(2). The process continues for all values of n. It should be observed with reference to FIG. 4 that the values v(1), v(2), and v(3) need not correspond to a sequential ordering of v-strips but can sample Fourier space in a random-appearing and yet programmable manner. The exact choice may be dictated by the relative importance of the various spatial frequencies. Having assigned the weighted signals to their respective strips in Fourier space, the final subtraction angiographic image may be reconstructed by taking the two-dimensional inverse Fourier transform of this array of strips. This leaves the desired image of the blood vessels without any other material or structure also appearing in the image.

Figure 5:
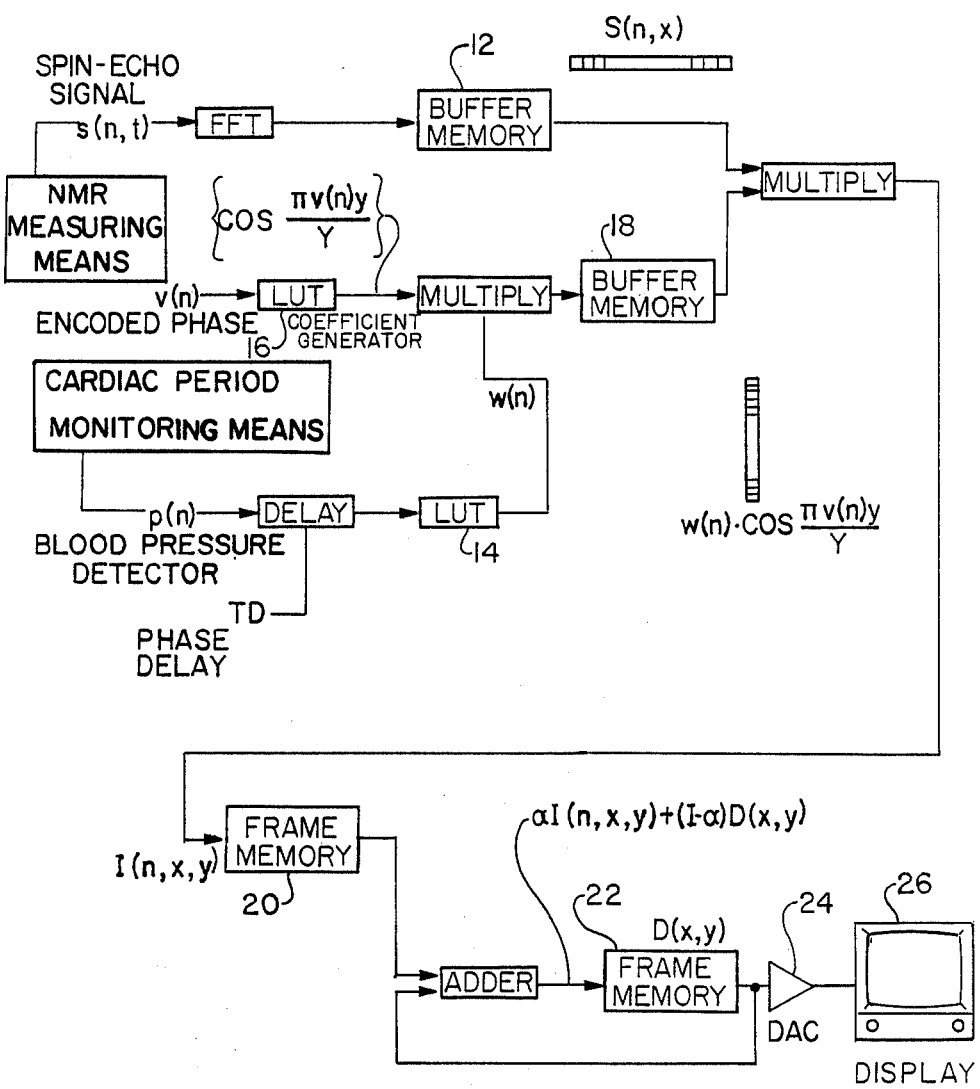
FIG. 5 is a schematic block diagram of an apparatus for performing the overall method of the invention.

Although the method described in detail above can be implemented on many standard NMR imaging systems, the invention further contemplates apparatus which would enable blood vessel imaging on a quasi-real time basis. That is, a difference image of blood vessels can be displayed on a video monitor and continuously updated as new high speed (20–50 msec) phase encodings are acquired. A schematic block diagram of an apparatus for performing the real time blood vessel imaging is shown in FIG. 5. For convenience of description, the assumption is made that the TR time for the RF signal is 33 msec which corresponds to a single video frame interval. After a particular pulse sequence repetition the digitized signal s(n,t), pulse reading p(n) and the specific phase encoded v(n) are all presented to the illustrated circuitry. The circuitry utilizes each of the three signals in the following manner to accomplish real time imaging. The spin-echo signal s(n,t) is subjected to a fast Fourier transform FFT to convert it from time (t) to space (x) domain and stored in memory 12. The blood pressure pulse signal is at first delayed by a phase (TD of FIG. 1B) and then used to generate a weighted coefficient w(n) by being processed through lookup table 14. As will be understood by those skilled in the art, lookup tables are digital memory devices which have a predetermined number of address inputs and outputs. By suitably loading the contents of each address in the table, the device can be provided with its own distinctive transfer function. Thus, each lookup table can perform the task of a function generator. Therefore, when phase delayed p(n) is input to lookup table 14, coefficient w(n) is generated. Finally, the encoded phase v(n) is Fourier transformed in lookup tatle 16 to generate a sequence of coefficients in the y direction.

After this preprocessing, the image contribution I(n,x,y) of this individual acquisition is generated. This is done with the sequence of multipliers shown. The same signal S(n,x) (the one-dimensional Fourier transform of s(n,t)) is fed to the circuitry for each line of the image. Successive lines are multiplied by different values of an exponential term stored in memory 18. The image contribution is given explicitly by the following formula:

$$I(n,x,y) = S(n,x) \cdot \exp\left[\frac{\pi i \, v(n) \, y}{Y}\right] \cdot w(n)$$

where Y is the field of view in the phase encoding direction. This contribution is first stored in frame memory 20 and then added to a running average of similar image contributions which are stored in frame memory 22, processed through digital-to-analog converter 24 and input to video display 26 to provide the net image.

In summary, a novel method is provided for NMR imaging of blood vessels at high speed. The reconstruction can be implemented on many generic NMR imaging systems in a retrospective fashion. Also, novel apparatus is provided for performing the reconstruction in real time during the actual image acquisition and thereby facilitating the optimization of diagnostic performance.

It will be understood that various details of the invention may be changed without departing from the scope of the invention. Furthermore, the foregoing description is for the purpose of illustration only, and not for the purpose of limitation—the invention being defined by the claims.

What is claimed is:

1. A high speed method of forming computed images of blood vessels based on measurements of characteristics of a body comprising the steps of:
    subjecting a predetermined body area containing blood vesesls of interest to, successively, a plurality of applications of a short repetition time (TR) NMR pulse sequence during the period of high blood velocity and then to a corresponding plurality of said applications during the period of low blood velocity for a plurality of successive heart beat cycles wherein each application during said period of high blood velocity corresponds to a different phase encoding and said sequence of phase encodings is substantially repeated during said period of low blood velocity and collecting data from which an image of the blood vessels can be formed;
    weighting the collected imaging data from each application of the NMR pulse sequence according to whether the data was acquired during the period of high blood velocity or a period of low blood velocity of the corresponding heart beat cycle;
    accumulating weighted imaging data from a plurality of NMR pulse sequences corresponding to high blood velocit:y periods and from a plurality of NMR pulse sequences corresponding to low blood velocity periods;
    subtracting said weighted imaging data corresponding to each specific phase encoding acquired during the high blood velocity periods from said weighted imaging data for the same phase encoding corresponding to low blood velocity periods in order to compute blood vessel imaging data; and
    forming an image of the blood vessels of interest from said blood vessel imaging data.

2. A method according to claim 1 wherein the NMR pulse sequence is a limited flip angle pulse sequence.

3. A method according to claim 2 wherein said limited flip angle is about 30°.

4. A method according to claim 1 wherein TR times are in the range of about 10-100 msec.

5. A method according to claim 1 wherein 128 individual phase encodings are acquired during high velocity periods and 128 individual phase encodings are acquired during low velocity periods.

6. A method according to claim 1 wherein each high velocity and each low velocity period of a heart beat cycle is subjected to about 10 applications of an NMR pulse sequence.

7. A method according to claim 1 wherein an image of the selected blood vessels can be obtained in about 5 to 20 seconds.

8. A method according to claim 1 wherein said subtracting step includes assigning said accumulated weighted imaging data to respective strips in Fourier space and taking a two-dimensional inverse Fourier transform of said strips.

9. A method according to claim 1 wherein said blood vessel image is displayed in real time on a video monitor.

10. A high speed method of forming computed images of blood vessels based on measurements of NMR characteristics of a body comprising the steps of:
    subjecting a predetermined body area containing blood vessels of interest to a plurality of applications of 2 variants of a short repetition time (TR) NMR pulse sequence, said variants devised such that images of static structure will appear substantially identical and images of moving structures will not, said plurality of applications being applied, successively, during the high blood velocity period of a heart beat cycle and then during the low blood velocity period of a heart beat cycle for each of a plurality of successive heart beat cycles, and collecting signal data from which images can be formed;
    applying each of said 2 variants of each of said plurality of applications of an NMR pulse sequence at each of a plurality of separate phase encodings;
    subtracting at each separate phase encoding said signal data measured from application of one of two said variants of said NMR pulse sequence from signal data measured from application of the other variant of said NMR pulse sequence in order to compute blood vessel imaging data; and
    forming an image of the blood vessels of interest from said blood vessel imaging data.

11. A method according to claim 10 wherein said NMR pulse sequence is a limited flip angle.

12. A method according to claim 11 wherein said limited flip angle is about 30°.

13. A method according to claim 10 wherein TR times are in the range of about 10-100 msec.

14. A method according to claim 10 wherein an image of the selected blood vessels can be obtained in about 5 to 20 seconds.

15. An NMR imaging system for constructing and displaying real time images of selected blood vessels of interest which are derived from NMR measurements comprising:
    means for monitoring the cardiac period;
    means for performing NMR measurements on blood vessels using, successively, a plurality of applications of a short repetition time (TR) NMR pulse sequence during the high blood velocity period of a heart beat cycle and then a plurality of said applications during the low blood velocity period for a plurality of succesive heart beat cycles, wherein each application during said period of high blood velocity corresponds to a different phase encoding and said sequence of phase encodings is substantially repeated during said period of low blood velocity, said pulse sequences each having a TR time of about 10-100 milliseconds;
    means for calculating and storing NMR measurement data and blood pressure data after each pulse sequence to generate imaging data, said means for calculating and storing serving to manipulate parameters including imaging data, encoded phase, and cardiac period;
    means for computing an average of previous successive imaging data contribution and adding each new imaging data contribution thereto to provide updated imaging data; and
    means for successively constructing and displaying blood vessel images based on said updated imaging data, said images being displayed on a real time basis.

16. An NMR imaging system according to claim 15 wherein said cardiac period monitoring means comprises an electrocardiograph.

17. An NMR imaging system according to claim 15 wherein said cardiac period monitoring means comprises an optical plethysmograph.

18. An NMR imaging system according to claim 15 wherein said cardiac period monitoring means comprises an ultrasonic pulse detector.

19. An NMR imaging system according to claim 15, wherein said means for calculating and storing includes means for subtracting NMR measurement data corresponding to the high blood velocity period of a plurality of heart beat cycles from data corresponding to the low blood velocity period of a plurality of heart beat cycles in order to cancel all image measurement data not corresponding to the blood vessels of interest.

20. An NMR imaging system according to claim 15 wherein said means for constructing and displaying includes a video monitor for displaying said real time images.

* * * * *